(12) United States Patent
Singh et al.

(10) Patent No.: US 8,525,556 B2
(45) Date of Patent: Sep. 3, 2013

(54) TIME-INTERLEAVED SAMPLE-AND-HOLD

(75) Inventors: Ramesh Kumar Singh, Sunnyvale, CA (US); Yusuf Haque, Woodside, CA (US); Donald E. Lewis, Navada City, CA (US)

(73) Assignee: Crest Semiconductors, Inc., San Jose, CA (US)

( * ) Notice: Subject to any disclaimer, the term of this patent is extended or adjusted under 35 U.S.C. 154(b) by 21 days.

(21) Appl. No.: 13/015,981

(22) Filed: Jan. 28, 2011

(65) Prior Publication Data

US 2012/0194223 A1    Aug. 2, 2012

(51) Int. Cl.
*G11C 27/02*    (2006.01)
(52) U.S. Cl.
USPC ............................. 327/94; 327/91; 341/122
(58) Field of Classification Search
USPC ................. 327/91, 94, 337; 341/122–125
See application file for complete search history.

(56) References Cited

U.S. PATENT DOCUMENTS

| 6,160,508 | A  | * | 12/2000 | Gustavsson et al. | 341/155 |
| 6,542,017 | B2 | * | 4/2003  | Manganaro | 327/291 |
| 6,570,410 | B2 | * | 5/2003  | Manganaro | 327/94 |
| 7,834,786 | B2 | * | 11/2010 | Kawahito et al. | 341/120 |

OTHER PUBLICATIONS

Gustaysson, M.; Tan, N.N.; , "A global passive sampling technique for high-speed switched-capacitor time-interleaved ADCs," Circuits and Systems II: Analog and Digital Signal Processing, IEEE Transactions on , vol. 47, No. 9, pp. 821-831, Sep. 2000.*
Manganaro, G.; , "An improved phase clock generator for interleaved and double-sampled switched-capacitor circuits," Electronics, Circuits and Systems, 2001. ICECS 2001. The 8th IEEE International Conference on , vol. 3, no., pp. 1553-1556 vol. 3, 2001.*
Gustavsson et al., CMOS Data Converters For Communications, Kluwer Academic Publishers, Boston, MA, USA 2000, p. 272-273, ISBN 0-7923-7780-X.

* cited by examiner

*Primary Examiner* — Patrick O'Neill
(74) *Attorney, Agent, or Firm* — Steven L. Nichols; Van Cott, Bagley, Cornwall & McCarthy P.C.

(57) ABSTRACT

A time-interleaved sample-and-hold system includes a first sample-and-hold circuit and a second sample-and-hold circuit. The first sample-and-hold circuit and the second sample-and-hold circuit share a common sampling switch. A method of remediating a timing offset between a first sample-and-hold circuit and a second sample-and-hold circuit in a time-interleaved sample-and-hold system includes switching at least one shunt capacitor disposed between two logic gates in a timing circuit to adjust a delay between a timing signal for a common sampling switch electrically coupled to the first and second sample-and-hold circuits and a timing signal for at least one of the sample-and-hold circuits.

37 Claims, 19 Drawing Sheets

US 8,525,556 B2

TIME-INTERLEAVED SAMPLE-AND-HOLD

BACKGROUND

Time-interleaving is the coordination of multiple lower-frequency devices to achieve a higher-frequency result. For example, some time-interleaved analog-to-digital converters coordinate the operations of two or more lower-frequency analog-to-digital converters to produce a digital output at a higher frequency, effectively replicating the effect of a single higher-frequency analog-to-digital converter. Time-interleaving allows for the use of slower, less-expensive components to produce high-frequency results that are prohibitively expensive or otherwise unfeasible to achieve with a single component.

Despite the advantages associated with time-interleaving multiple components, various logistical problems accompany the implementation of time-interleaving. One of these logistical problems is in the calibration of the timing of operations performed by the multiple components. For example, in a time-interleaved sampling operation, a clock signal may be used such that the first component samples on every even clock cycle and the second component samples on every odd cycle. In this example, the composite sample output from both sampling components will most accurately represent the signal being sampled if each sample is taken exactly one clock cycle after the previous sample. However, the high frequencies associated with sampling and the physical characteristics of the sampling components can introduce a static timing mismatch between the components, thereby distorting the accuracy of the time-interleaved sample.

BRIEF DESCRIPTION OF THE SEVERAL VIEWS OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

The present specification discloses systems and methods of time-interleaving sample-and-hold circuits. As discussed above, timing mismatches between components in a time-interleaved system can introduce error into results output by the system. The systems and methods described herein mitigate timing mismatches between two time-interleaved sample-and-hold circuits through the use of a common series sampling switch connected to both sample-and-hold circuits. Because the common series sampling switch is activated with a regular pattern at each cycle of a clock signal, the existence of fixed timing offset errors between the two sample-and-hold circuits is reduced or eliminated. Additionally, the present specification discloses methods of dynamically reducing timing offsets between switches of a first sample-and-hold circuit and switches of a second sample-and-hold circuit through the use of switchable capacitors in timing circuitry.

As used in the present specification and in the appended claims, the term "switch" refers broadly to a physical component that selectively opens and closes an electrical circuit, including integrated and discrete semiconductor transistors.

As used in the present specification and in the appended claims, the term "sampling switch" refers to a switch that enables sampling through opening or closing.

As used in the present specification and in the appended claims; the term "control signal" when used in the context of a particular switch, refers to an electrical signal that dictates when the switch opens and/or closes.

As used in the present specification and in the appended claims, the term "logic gate" refers to a circuit or block that performs a logical operation on one or more digital logic inputs to produce a digital logic output.

It should be understood that while the following examples and the attached Figures describe the principles of the present specification in the context of a time-interleaved sample-and-hold system using two separate sample-and-hold circuits, the principles described herein are not limited to the use of only two sample-and-hold circuits. Rather, the principles described herein may also be successfully applied to time-interleaved systems of three or more sample-and-hold circuits.

Figure 1:
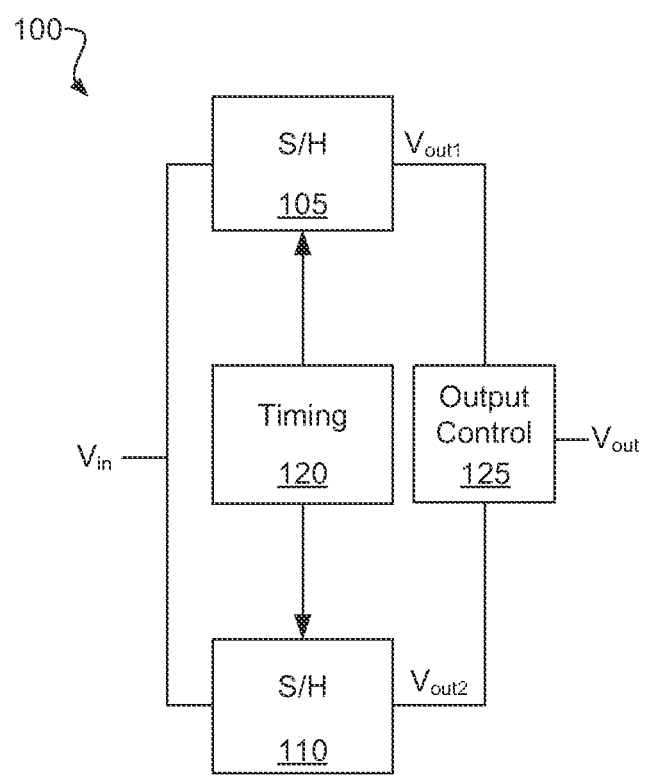
FIG. 1 is a diagram of an illustrative time-interleaved sample-and-hold system, according to one example of principles described herein.

Referring now to the Figures, FIG. 1 shows a diagram of an illustrative time-interleaved sample-and-hold system (100), according to one example of principles described herein. The system (100) includes a first sample-and-hold circuit (105), a second sample-and-hold circuit (110), and a timing block (120). Each of the sample-and-hold circuits (110) may be configured to receive a variable analog input voltage signal ($V_{in}$), sample the voltage of the signal, and output the sampled voltage to the output signal ($V_{out}$) of the system (100) for a specified amount of time. The timing block (120) includes circuitry configured to alternately control the first and second sample-and-hold circuits (105, 110) such that while the first sample-and-hold circuit (105) is outputting a held voltage to the output signal ($V_{out}$), the second sample-and-hold circuit (110) is sampling the input voltage signal ($V_{in}$), and vice versa. An output control block (125) may control which of the sample-and-hold circuits (105, 110) contributes to the output signal ($V_{out}$) at any given time.

Thus, the timing block (120) time-interleaves the two sample-and-hold circuits (105, 110) to produce a single sample-and-hold output at the output node ($V_{out}$). Because of the alternating cycles of the sample-and-hold circuits (105, 110), the sample-and-hold output at the output node ($V_{out}$) may be the effective equivalent of the output from a single sample-and-hold circuit (105, 110) operating at twice the speed that the first and second sample-and-hold circuits (105, 110) achieve individually. This time-interleaved arrangement can provide many advantages. For example, the two sample-and-hold circuits (105, 110) may be used to achieve sample-and-hold results at speeds that are cost-prohibitive or physically impossible to achieve with a single sample-and-hold circuit.

The use of time-interleaved sample-and-hold circuits can be applied to any circuit or application for which a high-bandwidth sample-and-hold output is desirable. For example, time-interleaved sample-and-hold circuits (105, 110) may be used in a high-speed analog-to-digital converter to increase the accuracy of a digital representation of an analog signal.

However, the output accuracy of a time-interleaved sample-and-hold system, such as the system (100) described in FIG. 1, may be degraded by any timing mismatch between the first sample-and-hold circuit (105) and the second sample-and-hold circuit (110). For example, consider a scenario in which each of the first and second sample-and-hold circuits (105, 110) is able to sample at 125 million samples per second. In this scenario, the timing block (120) may cause the first and second sample-and-hold circuits (105, 110) to sample on alternating cycles of a 250 MHz clock signal to create a 250 million samples per second output signal ($V_{out}$). However, if the first sample-and-hold circuit (105) takes its sample at time t0 and the second sample-and-hold circuit (110) fails to take its sample at exactly t0+4 ns, the performance of the time-interleaved sample-and-hold system (100) is degraded because the output of the system (100) fails to accurately represent the input voltage signal ($V_{in}$). Thus, a Fast Fourier Transform (FFT) of the output signal ($V_{out}$) would show a separate signal for each of the sample-and-hold circuits (105, 110).

Figure 2:
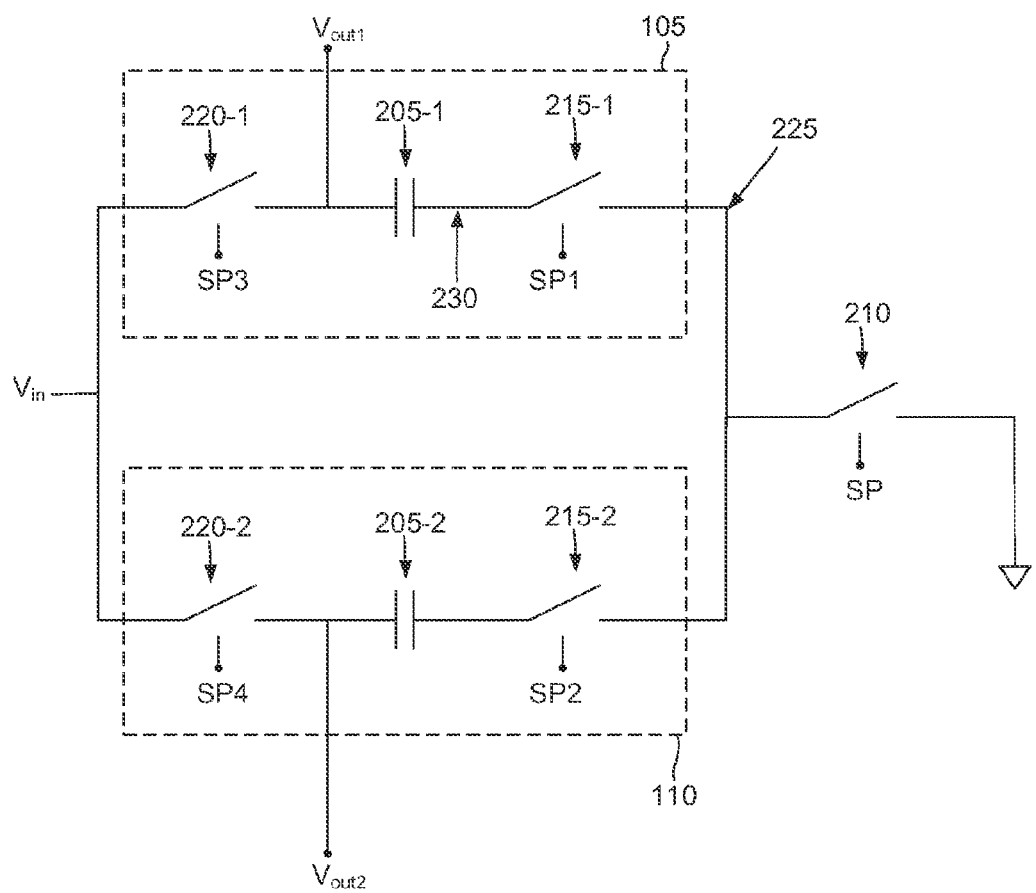
FIG. 2 is a diagram of illustrative sample-and-hold circuits in an illustrative time-interleaved sample-and-hold system, according to one example of principles described herein.

FIG. 2 shows a diagram of illustrative first and second sample-and-hold circuits (105, 110) in a time-interleaved sample-and-hold system (100). Each of the sample-and-hold circuits (105, 110) includes a voltage storage element (205-1, 205-2) for holding a voltage sampled from the input signal ($V_{in}$). As shown in FIG. 2, the voltage storage elements (205-1, 205-2) may be capacitors. A voltage-controlled common sampling switch (210) may selectively couple each of the sample-and-hold circuits (105, 110) to a common node, such as ground. Each sample-and-hold circuit (105, 110) may include a voltage-controlled input switch (215-1, 215-2, respectively) that selectively couples its respective voltage storage element (205-1, 205-2) to the common sampling switch, and a voltage-controlled switch (220-1, 220-2, respectively) that selectively couples each voltage storage element (205-1, 205-2) to the input signal ($V_{in}$).

Figure 3:
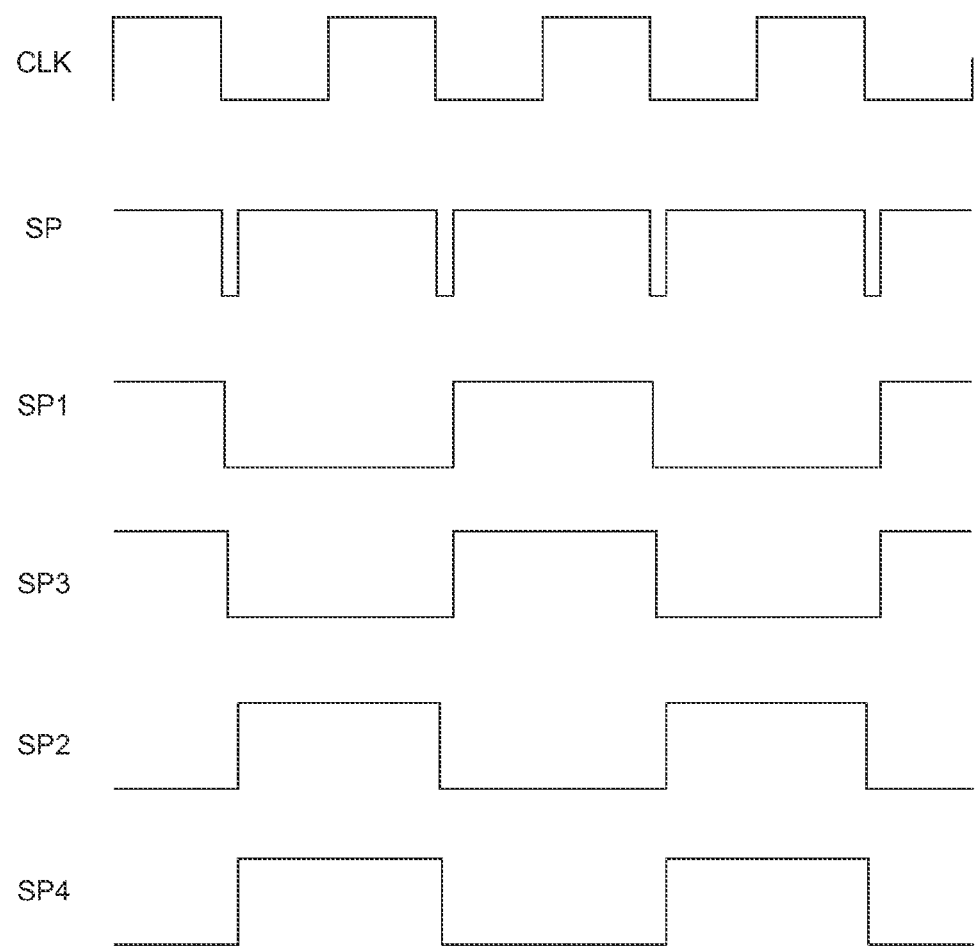
FIG. 3 is a diagram of an illustrative timing diagram for an illustrative time-interleaved sample-and-hold system, according to one example of principles described herein.

Each of the switches (210, 215-1, 215-2, 220-1, 220-2) shown in FIG. 2 may be controlled by a corresponding control signal (SP, SP1, SP2, SP3, SP4) from a timing block (120, FIG. 1). FIG. 3 shows an illustrative timing diagram for each of these control signals with reference to a clock signal. In the timing diagram of FIG. 3, a high signal for a switch signifies that that switch will be closed.

The operation of the illustrative sample-and-hold circuits (105, 110) will now be explained with reference to FIGS. 2-3. For a first sample, the common sampling switch (210) opens first to stop the sample, which triggers switch (215-1) to open, followed by switch (220-1). At this point a voltage from ($V_{in}$) is now stored in the voltage-storage element (205-1) of the first sample-and-hold circuit (105), constituting the output of the first sample-and-hold circuit (105), which is provided to the output ($V_{out}$) of the entire system. After the switches of the first sample-and-hold circuit are open, the common sampling switch (210) closes again, which triggers the switches (215-2, 220-2) to close, thereby beginning the sampling cycle of the second sample-and-hold circuit (110). The common sampling switch (210) then opens again, which ends the sampling cycle of the second sample-and-hold circuit (110) by triggering switches (215-2) to open, followed by switch (220-2). Shortly thereafter, the common sampling switch (210) closes again, thereby triggering the switches (215-1, 220-1) of the first sample-and-hold circuit (105) to close, begin a new sampling cycle, and causing the output from the second sample-and-hold circuit (110) to be provided to the output ($V_{out}$) of the entire system. This cycle continuously repeats to provide a time-interleaved sample-and-hold output ($V_{out}$) which is updated at each falling edge of the clock signal.

The incorporation of a series common sampling switch (210) with both of the sample-and-hold circuits (105, 110) mitigates the timing problems associated with parasitic capacitance. To illustrate the problems posed by these parasitic capacitances, consider the end of a sampling cycle for the first sample-and-hold circuit (105).

Because the opening of the common sampling switch (210) triggers the opening of switch (215-1), an interval of time exists between the opening of the common sampling switch (210) and the opening of the switches (215-1, 220-1) of the first sample-and-hold circuit (105). During this time interval, a high-frequency input signal may affect the value sampled because the switches (215-1, 220-1) of the first sample-and-hold circuit (105) remain closed while the capacitor voltage storage element (205-1) forms a capacitor divider circuit with the total parasitic capacitance between node (225) and ground. This condition may cause the sampled value of ($V_{in}$) to change by the ratio of $C_p/C_s$ for the time interval between the common sampling switch (210) opening and the switch (215-1) opening, where $C_p$ is the total parasitic capacitance between node (225) and ground, and where $C_s$ is the capacitance of capacitor storage element (205-1).

Similarly, the value of ($V_{in}$) sampled will change by the ratio of $C_{p1}/C_s$ for the time interval between the closing of switch (215-1) and switch (220-1), where $C_{p1}$ is the total parasitic capacitance between node 230 and ground when switch (215-1) is open and switch (220-1) is closed. The effects of the parasitic capacitances of the second sample-and-hold circuit (110) minor those described with respect to the first sample-and-hold circuit (105).

Despite these effects from parasitic capacitances, a Fast Fourier Transform of the time-interleaved output of the two sample-and-hold circuits (105, 110) may appear as a single signal if three conditions are met: (1) the time interval between the falling edge of SP and the falling edge of SP1 at the end of the sampling period of the first sample-and-hold circuit (105) substantially matches time interval between the falling edge of SP and the falling edge of SP2 at the end of the sampling period of the second sample-and-hold circuit (110); (2) the time interval between the falling edge of SP1 and the falling edge of SP3 at the end of the sampling period of the first sample-and-hold circuit (105) substantially matches the time interval between the falling edge of SP2 and the falling edge of SP4 at the end of the sampling period of the second sample-and-hold circuit (110); and (3) similar components are used in the first and second sample-and-hold circuits (105, 110).

The use of a common sampling switch (210) reduces the extent to which the aforementioned time intervals for the first and second sample-and-hold circuits (105, 110) must match by the ratio of $C_p/C_s$. In other words, the degree to which the aforementioned time intervals must match is significantly reduced by the use of a common sampling switch (210) instead of a separate sampling switch for each sample-and-hold circuit (105, 110). In a practical circuit, the ration of $C_p/C_s$ may be on the order of 10 to 1. Thus, where a timing match of 50 fs may be required to interleave two sample-and-hold circuits with independent sampling switches, a timing match of only 500 fs may be necessary to interleave two sample-and-hold circuits (105, 110) with a common sampling switch (210).

FIGS. 4-6D illustrate various illustrative examples of arrangements of logical gates that may be used in timing circuitry to implement the timing diagram of FIG. 3. It should be understood that the addition of additional components, such as amplifiers, flip-flops, and logic gates may be used according to what may best suit a particular embodiment of these principles.

Figure 4:
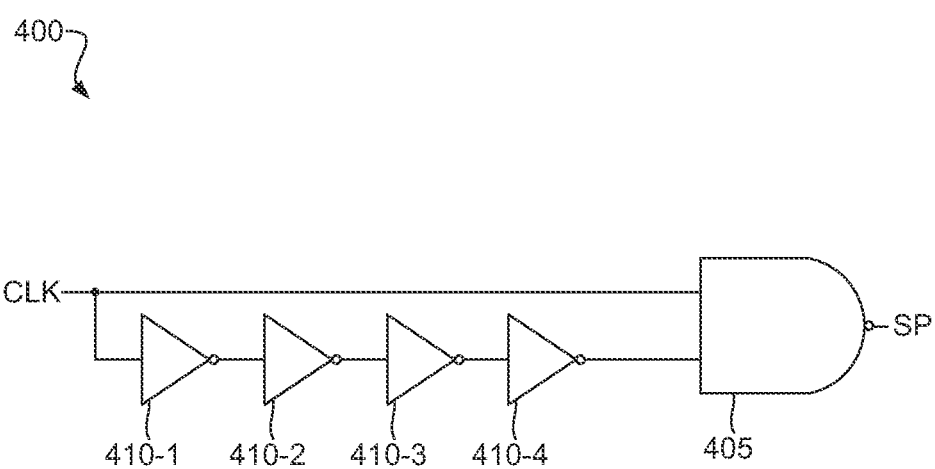
FIG. 4 is a diagram of illustrative timing circuitry for an illustrative time-interleaved sample-and-hold system, according to one example of principles described herein.

FIG. 4 shows an illustrative diagram of circuitry (400) that may be used to derive the SP signal of FIG. 3, which controls the common sampling switch (210, FIG. 2), from a clock signal (CLK). A NAND gate (405) receives the unaltered CLK signal as one input and a delayed version of the CLK signal as its other input. The CLK signal may be delayed using, for example, a set of CMOS inverters (410-1 to 410-4).

Figure 5:
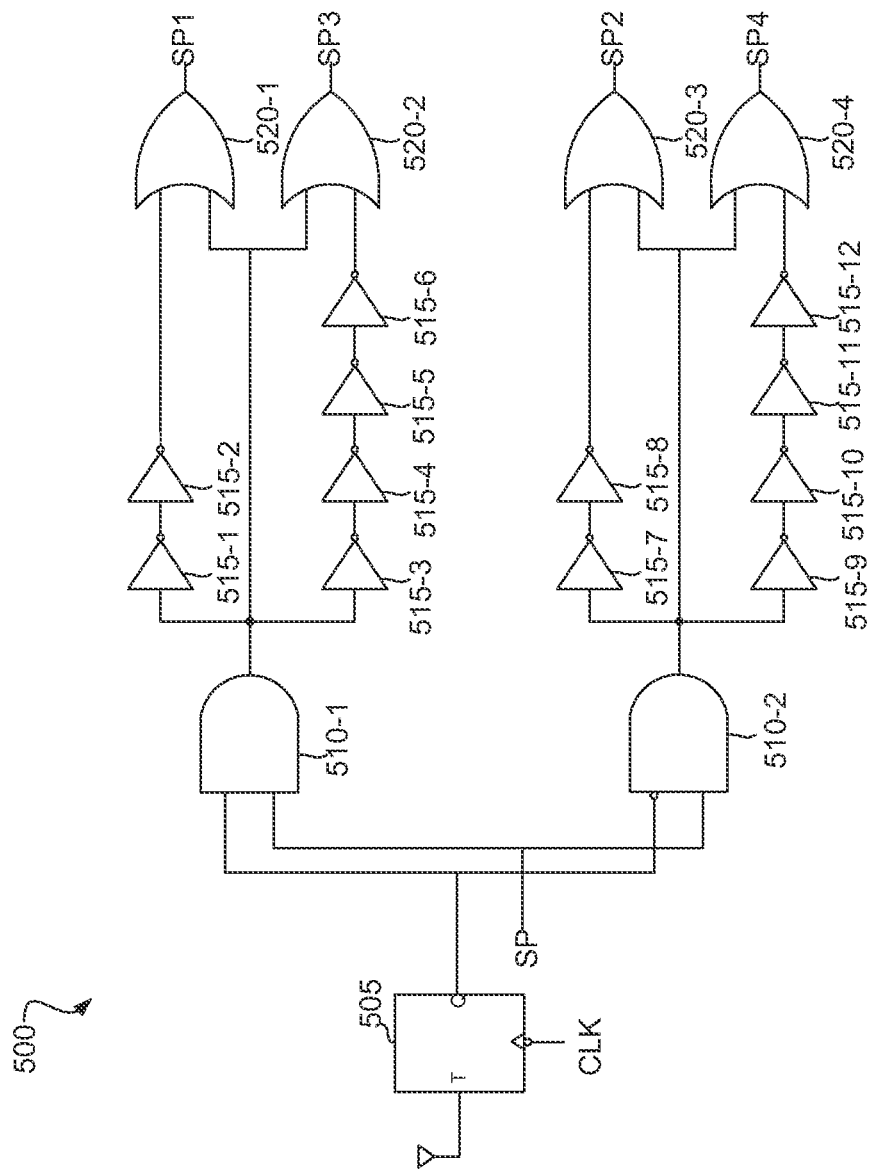
FIG. 5 is a diagram of illustrative timing circuitry for an illustrative time-interleaved sample-and-hold system, according to one example of principles described herein.

FIG. 5 shows a diagram of illustrative circuitry (500) that may be used to derive the SP1, SP3, SP2, and SP4 control signals of FIG. 3, which control switches (215-1, 220-1, 215-2, 220-2, respectively) of FIG. 2, A toggle flip-flop (505) may alternate between a 1 output and a 0 output at each falling edge cycle of CLK. The output of the toggle flip-flop (505) may be provided to a first NAND gate (510-1) and to a second NAND gate (510-2), where the first NAND gate (510-1) treats the output of the toggle flip-flop (505) as an input and the second NAND gate (510-2) treats the inverse of the output of the toggle flip-flop (505) as an input. Each NAND gate (510-1, 510-2) also receives the SP signal as its other input.

A first OR gate (520-1) takes the unaltered output of the first NAND gate (510-1) with a delayed version of the output of the first NAND gate (510-1) as inputs to produce the SP1 signal. A second OR gate (520-2) takes the unaltered output of the first NAND gate (510-1) with a slightly more delayed version of the output of the first NAND gate (510-1) as inputs to produce the SP3 signal. A third OR gate (520-3) takes the unaltered output of the second NAND gate (510-2) with a delayed version of the output of the second NAND gate (510-2) as inputs to produce the SP2 signal. A fourth OR gate (520-4) takes the unaltered output of the second NAND gate (510-2) with a slightly more delayed version of the output of the second NAND gate (510-2) as inputs to produce the SP4 signal.

CMOS inverters (515-1 to 515-12) are used to introduce delayed versions of the outputs of the first and second NAND gates (510-1, 510-2). By controlling these delays in the manner described above, the timing diagram of FIG. 3 can be implemented such that a falling edge of SP1 occurs slightly after a falling edge of SP on every odd clock cycle, and a falling edge of SP3 occurs slightly after a falling edge of SP1. Similarly, a falling edge of SP2 occurs slightly after a falling edge of SP on every even clock cycle, and a falling edge of SP4 occurs slightly after a falling edge of SP2.

Referring now to FIGS. 6A-6E, various alterations to the timing circuitry of FIGS. 4-5 are shown to remedy timing mismatches between the first sample-and-hold circuit (105, FIGS. 1-2) and the second sample-and-hold circuit (FIGS. 1-2). In other words, the timing circuitry shown in FIGS. 6A-6D includes additional components that allow for the adjustment of the time interval between the falling edges of SP and SP1 to more closely match the time interval between the falling edges of SP and SP2, and vice versa. Similarly, the timing circuitry shown in FIGS. 6A-6D includes additional components that allow for the adjustment of the time interval between the falling edges of SP1 and SP3 to more closely match the time interval between the falling edges of SP2 and SP4, and vice versa. These adjustments may be controlled by timing trim control signals TT1 to TT16, as demonstrated in the Figures.

Figure 6A:
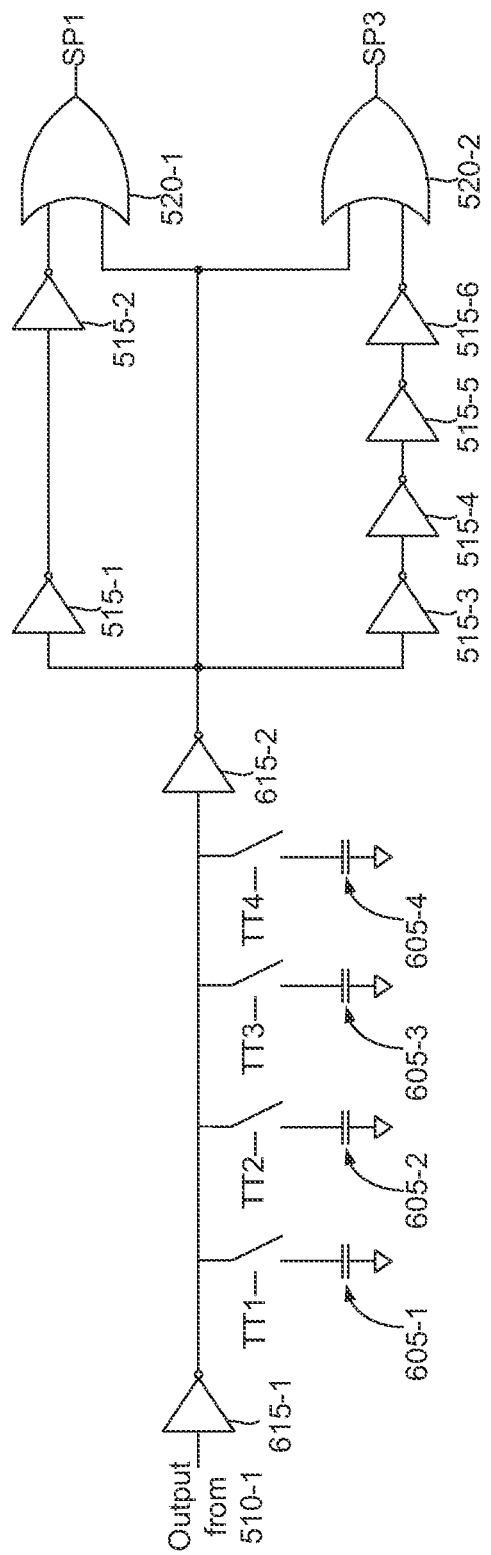
FIGS. 6A-6E are diagrams of illustrative adjustable timing circuitry for an illustrative time-interleaved sample-and-hold system, according to one example of principles described herein.

Referring now specifically to FIG. 6A, the first and second OR gates (520-1, 520-2) of FIG. 5, with the addition of two inverters (615-1, 615-2) and a plurality of switchable shunt are shown with the addition of a plurality of switchable shunt capacitors (605-1 to 605-4) between the output from the first AND gate (510-1). Because each shunt capacitor (605-1 to 605-4) can introduce an element of delay in the propagation of a digital signal change from the output of the first AND gate (510-1) to the first OR gate (520-1). Because the output from the first AND gate (510-1) is based on SP, the time interval between a change in SP and a corresponding change in SP1 can be modified by selectively opening or closing the switches of the switchable capacitors (605-1 to 605-4) to add or remove shunt capacitance. The switches of the switchable capacitors (605-1 to 605-4) may be selectively opened and closed using control signals SC1 to SC4. While four switchable shunt capacitors (605-1 to 605-4) are shown in FIG. 6A, more or fewer switchable shunt capacitors may be used as may suit a particular application, and in accordance with a desired amount of flexibility in adjusting the delay between SP and SP1. Additionally, the value of each switchable capacitor (605-1 to 605-4) may vary according to a desired amount of delay to be associated with each capacitor (605-1 to 605-4). In certain examples, the value of each switchable capacitor (605-1 to 605-4) may be the same, while in other examples the value of different switchable capacitors (605-1 to 605-4) may be different.

Figure 6B:
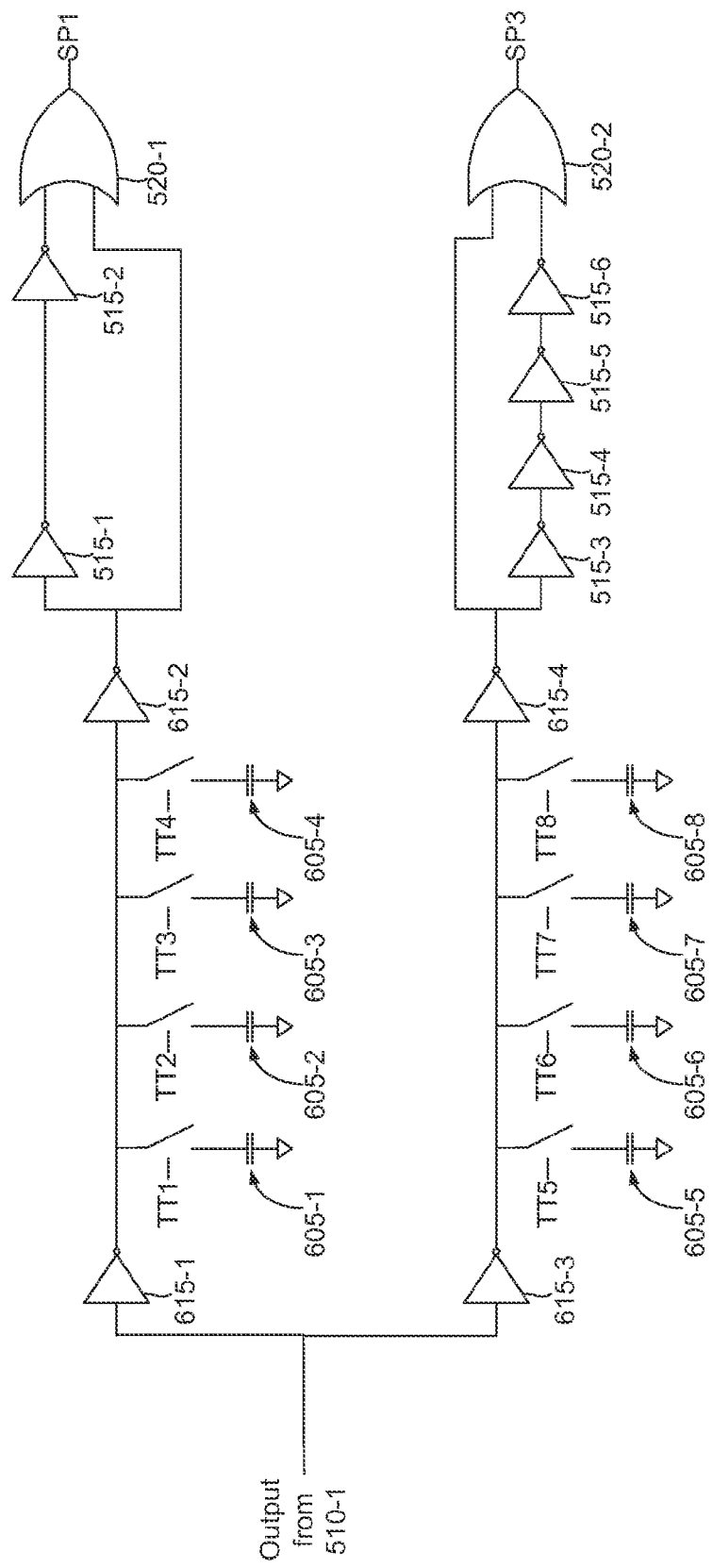

Referring now to FIG. 6B, the first and second OR gates (520-1, 520-2) of FIG. 5 are shown, this time with a separate set of switchable capacitors (615-1 to 615-4, 615-5 to 615-8) between two inverters (615-1 to 615-4) for each OR gate (520-1, 520-2). In this way, the delay between SP and SP1 can be adjusted independently from the delay between SP and SP3 such that the delay between SP1 and SP3 can also be adjusted as needed to compensate for a timing offset between the first sample-and-hold circuit (105, FIGS. 1-2) and the second sample-and-hold circuit (110, FIGS. 1-2).

Figure 6C:
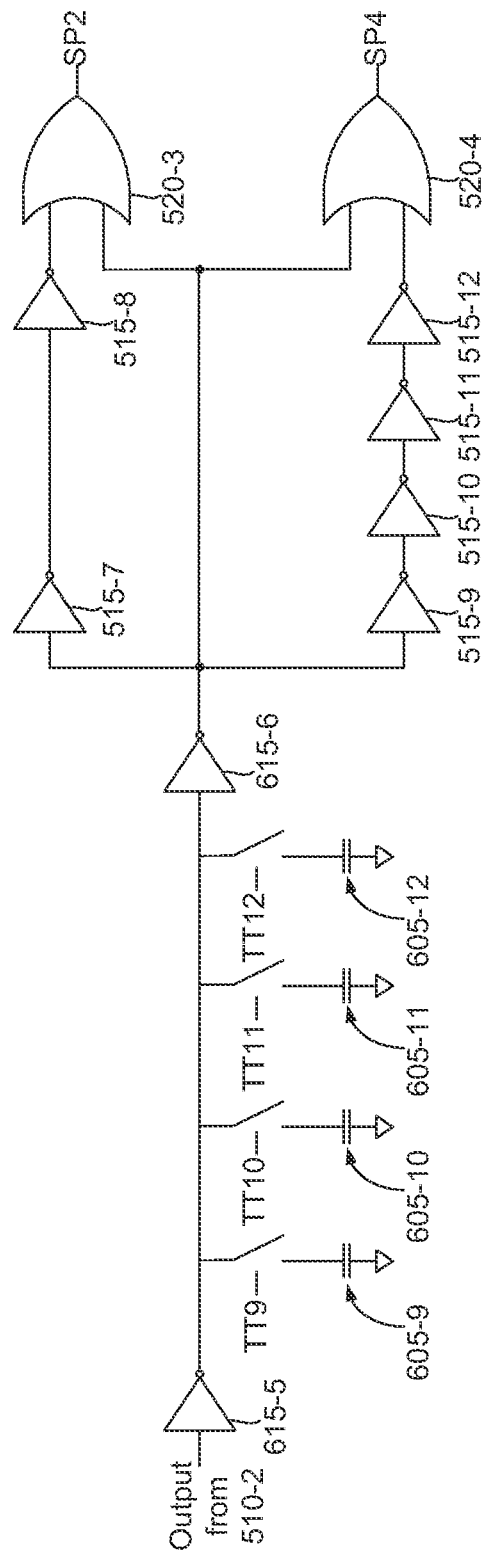
Figure 6D:
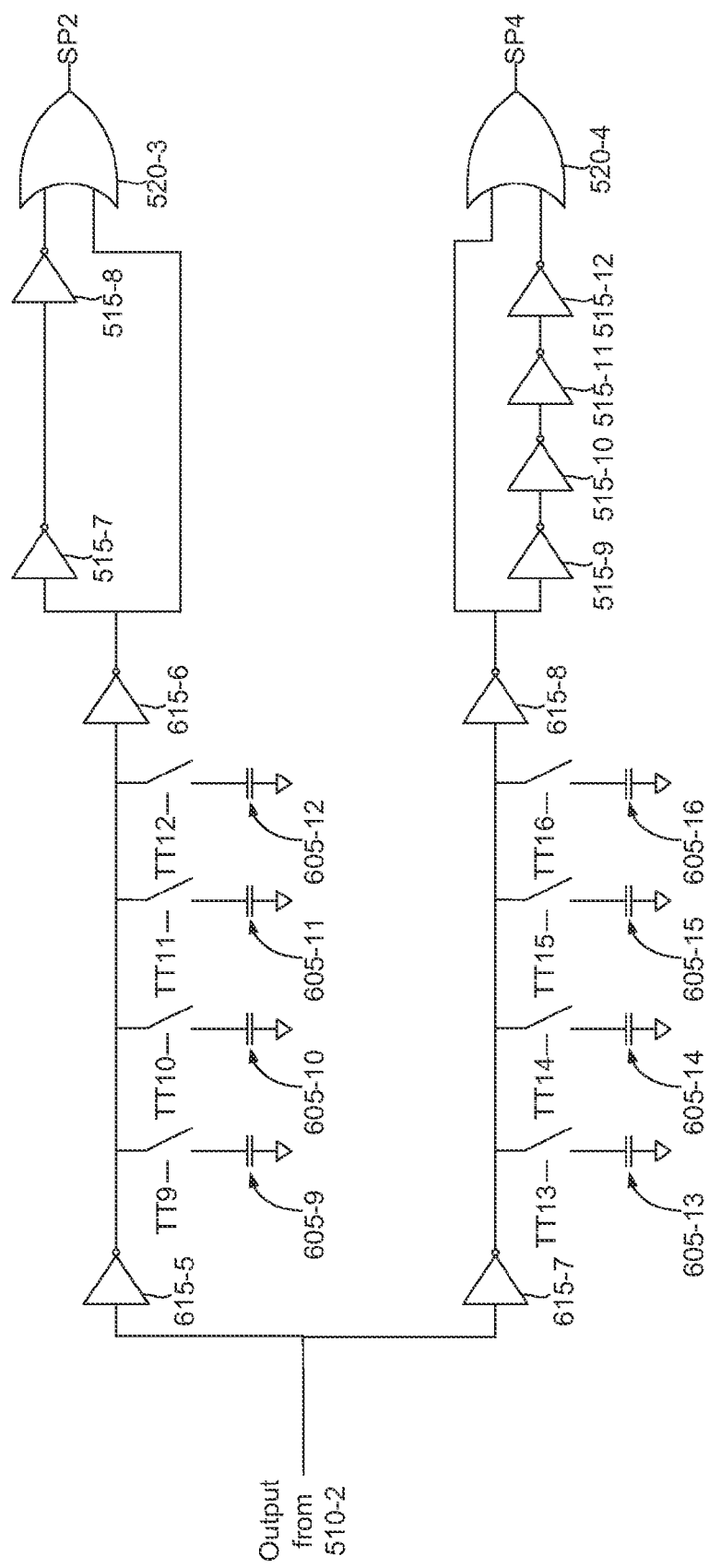

Referring now to FIG. 6C, the third and fourth OR gates (520-3, 520-4) of FIG. 5 are shown with the addition of two inverters (615-5, 615-6) and a plurality of switchable capacitors (605-9 to 605-12) to selectively adjust the delay between SP and SP2 at the end of the sampling cycle of the second sample-and-hold circuit (110, FIGS. 1-2). Similarly, FIG. 6D shows the third and fourth OR gates (520-3, 520-4) with a separate set of inverters (615-7 to 615-8) and switchable capacitors (605-9 to 605-16) for each OR gate (520-3, 520-4) for the independent selective adjustment of the delay between SP and SP2 and the delay between SP and SP4. In this way, the delay between SP2 and SP4 may also be selectively adjusted.

Figure 6E:
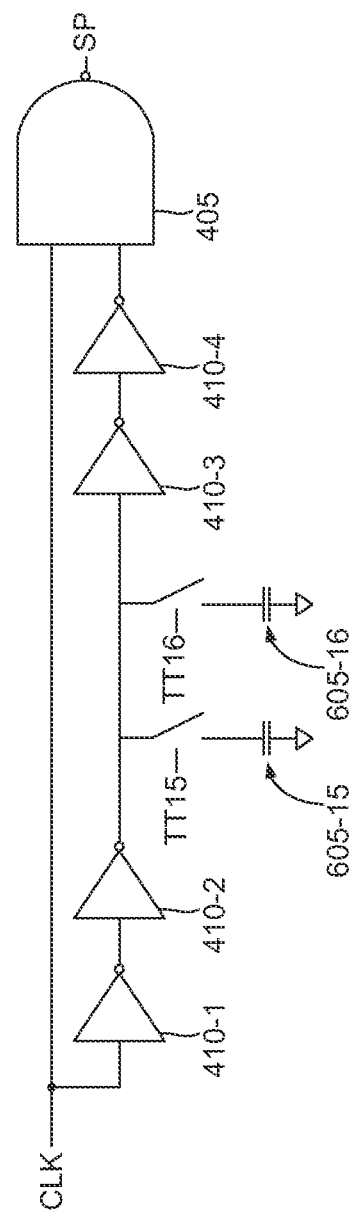
Figure 7A:
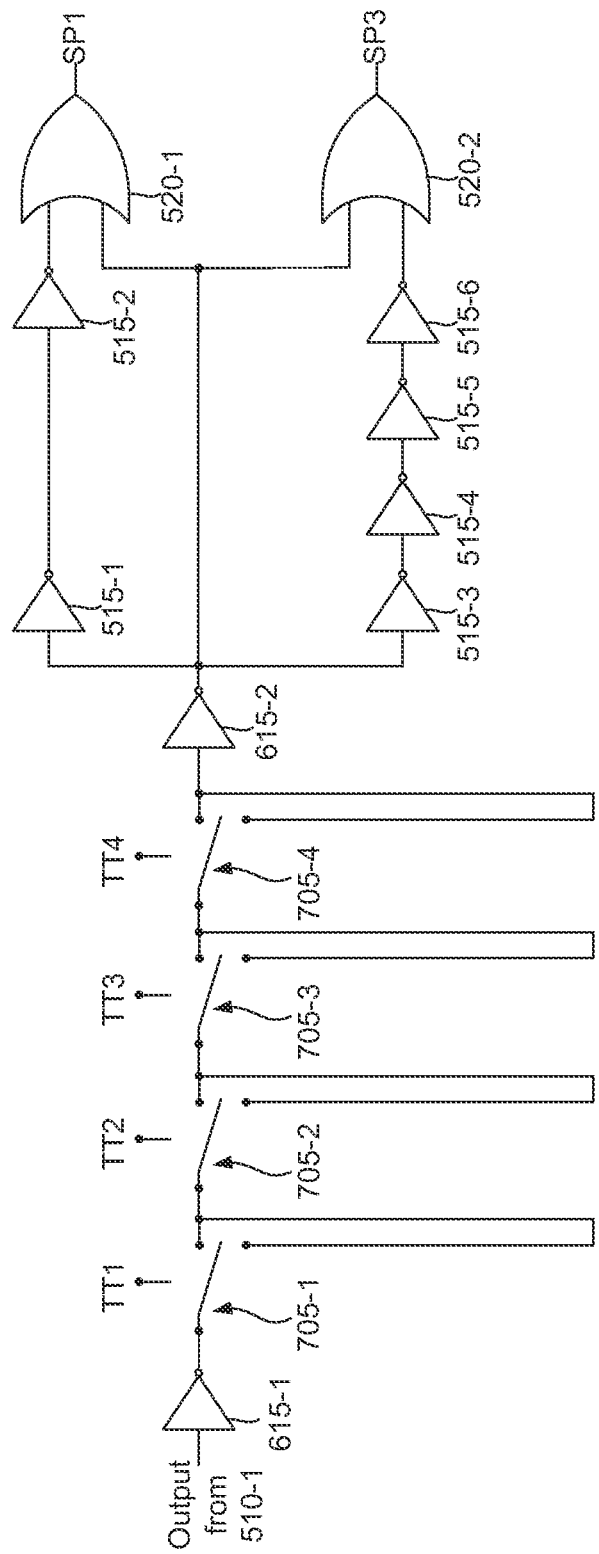
FIGS. 7A-7E are diagrams of illustrative adjustable timing circuitry for an illustrative time-interleaved sample-and-hold system, according to one example of principles described herein.
Figure 7B:
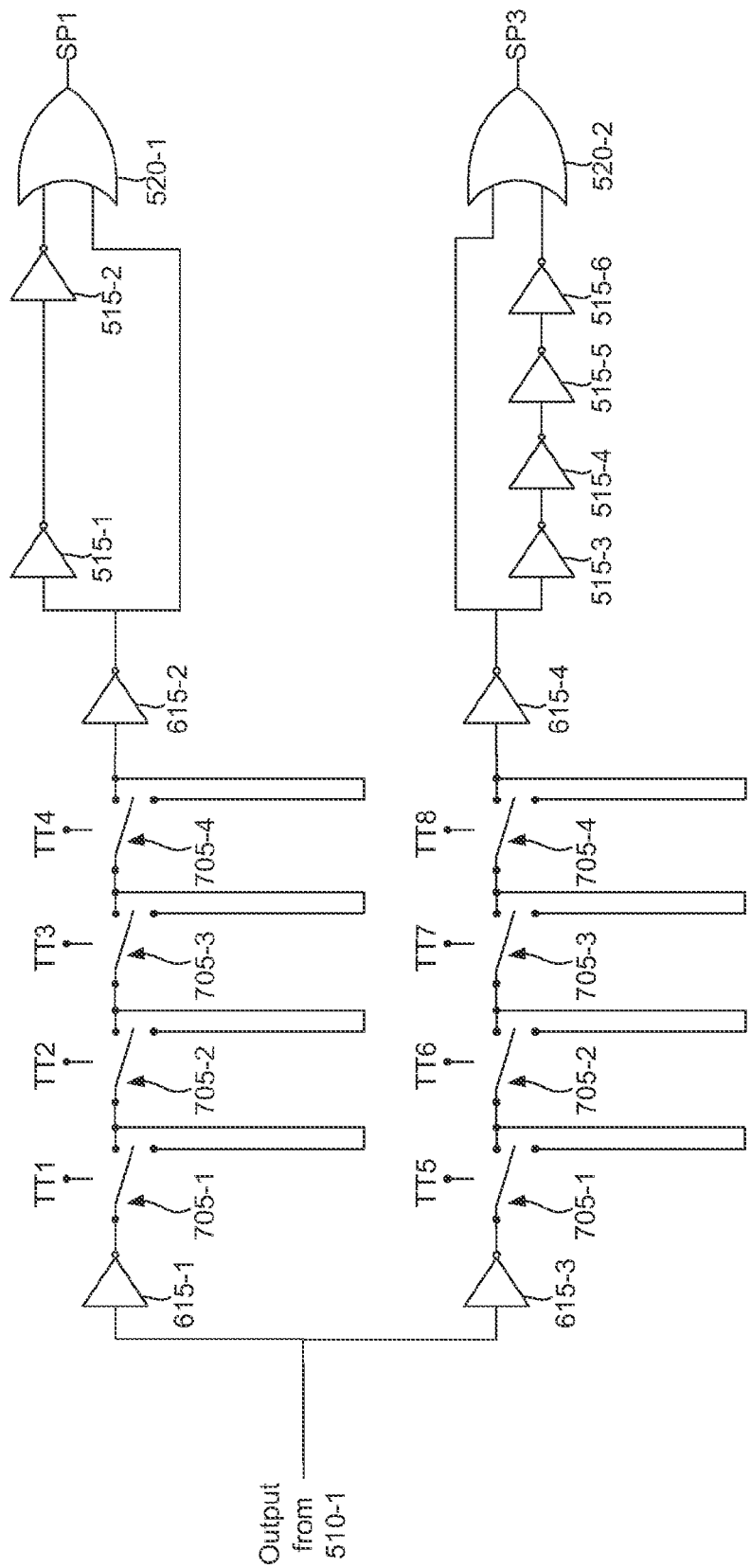
Figure 7C:
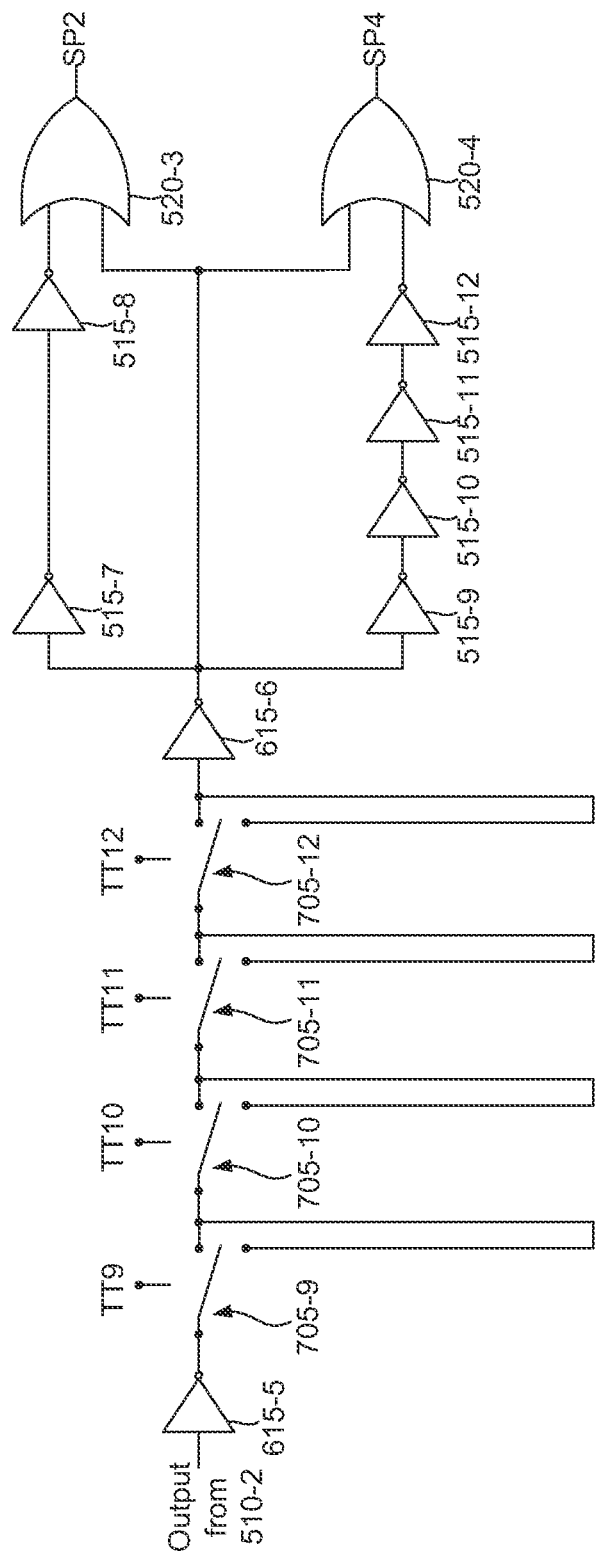
Figure 7D:
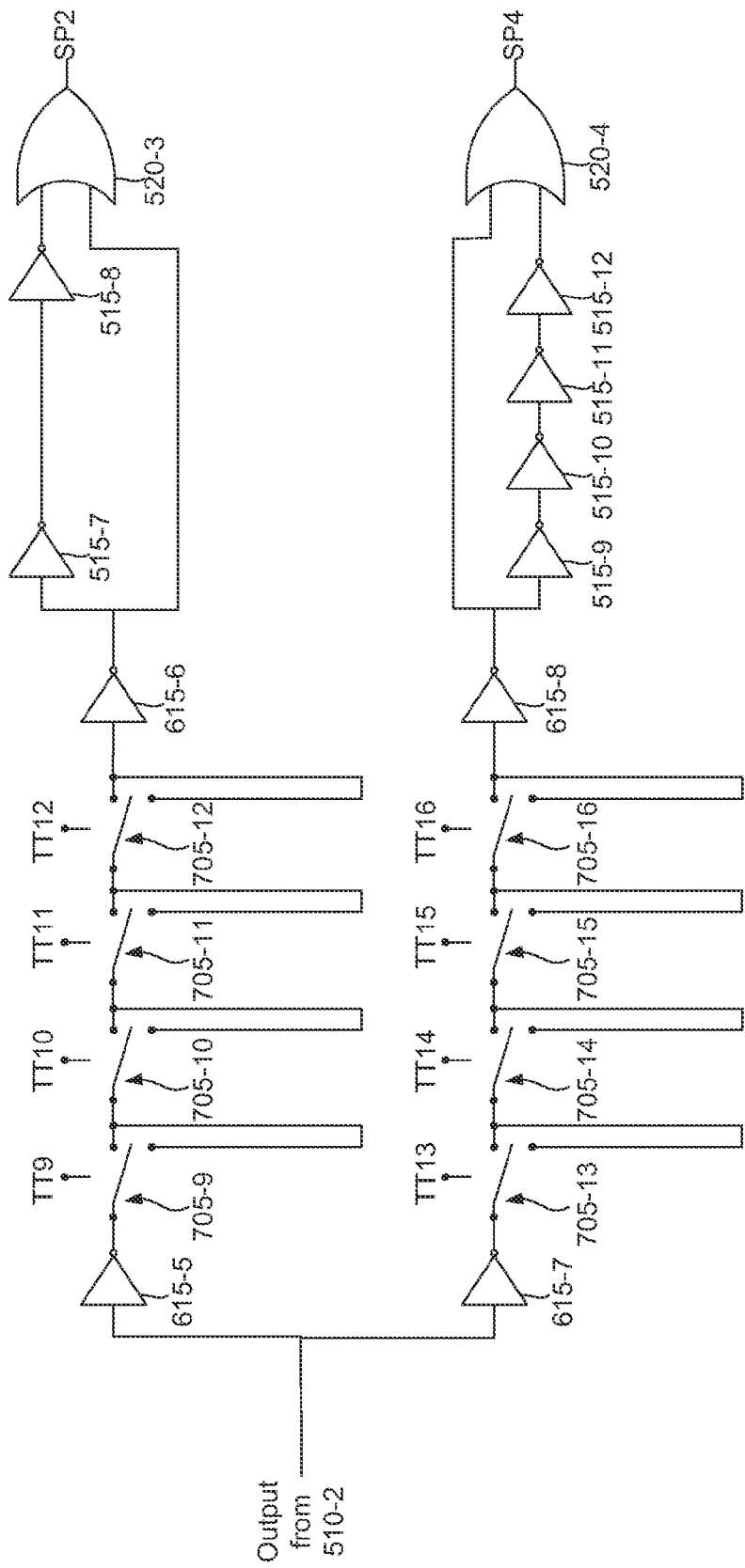
Figure 7E:
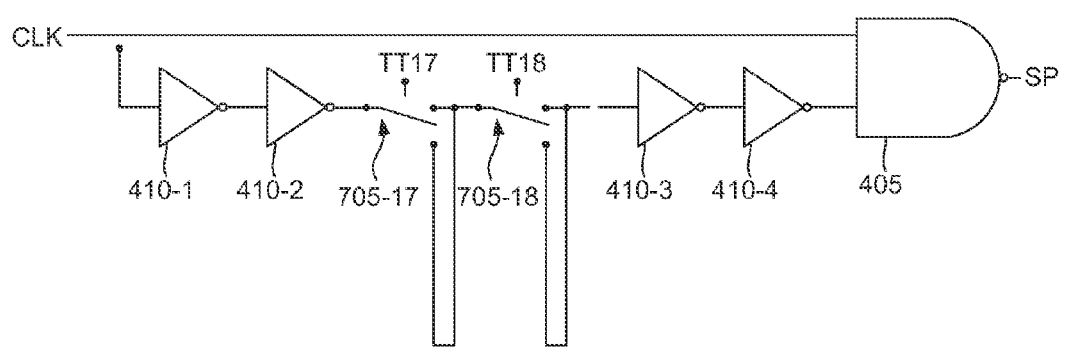

Referring now to FIG. 6E, it may also be desirable to adjust the timing of the control signal (SP) for the common sampling switch (210, FIG. 2) of a time-interleaved sample-and-hold system. One appropriate method of doing so is through the inclusion of additional switchable capacitors (605-13, 605-14) in the timing circuitry of FIG. 4 such that the timing relationship between the clock signal and SP may be selectively adjusted.

Referring now to FIGS. 7A-7E, an additional or alternative method of selectively adjusting the timing of control signals for the sample-and-hold circuits (105, 110, FIGS. 1-2) and/or the common sampling switch (210, FIG. 2) is to use selectively extensible conductive paths in between logic gates of the timing circuitry. By lengthening or shortening the conductive path between the logic gates, the delays between timing signals can be selectively increased and decreased. FIGS. 7A-7E illustrate this approach in the context of the timing circuitry shown in FIGS. 6A-6E. The difference between the timing circuitry shown in FIGS. 6A-6E and that of FIGS. 7A-7E is that the timing circuitry of FIGS. 7A-7E replaces the switchable capacitors (605-1 to 605-16) of FIGS. 6A-6E with double-throw switches (705-1 to 705-18) which allow for the selective increasing and decreasing of conductive paths between logic gates. Each double-throw switch (705-1 to 705-18) allows for the selection between a short conductive path and a longer alternative conduction path. The operation of these double-throw switches (705-1 to 705-18) may also be controlled by timing trim control signals TT1-TT16, respectively.

Figure 8A:
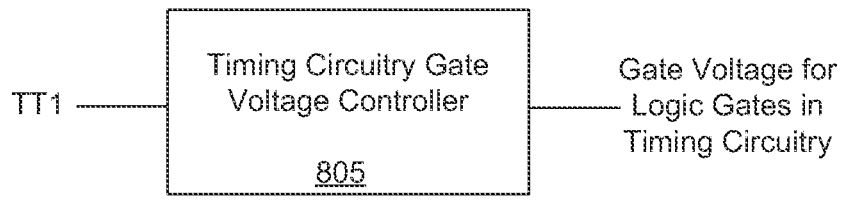
FIGS. 8A-8B are diagrams of illustrative control blocks for adjusting gate voltages of transistors in timing circuitry, according to one example of principles described herein.
Figure 8B:
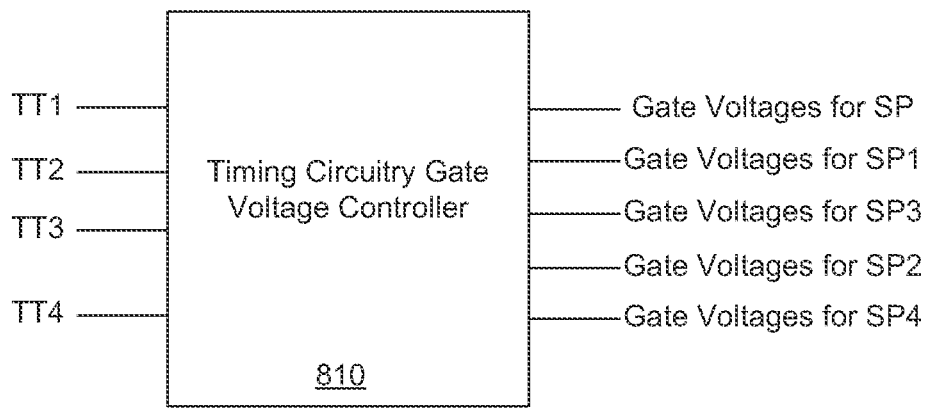

Referring now to FIGS. 8A-8B, an additional or alternative method of selectively adjusting the timing of control signals for the sample-and-hold circuits (105, 110, FIGS. 1-2) is to selectively adjust the gate voltage used to activate or deactivate transistors in the logic gates of the timing circuitry for the sample-and-hold circuits (105, 110, FIGS. 1-2) and/or the common sampling switch (210, FIG. 2). This method relies at least in part on the principle that a transistor will operate more slowly at lower voltages. Thus, by starving the gate voltage of one or more transistors in one or more of the logic gates shown in FIGS. 4-5, delay can be introduced into timing signals affected by that transistor.

FIG. 8A shows an exemplary timing circuitry gate voltage controller block (805) which receives a timing trim control signal TT1 and adjusts the gate voltage of each of the logic gates in the timing circuitry. This type of wholesale control over all gate voltages in the timing circuitry may be useful in increasing or decreasing the overall speed of the sample-and-hold circuits (105, 110, FIGS. 1-2).

FIG. 8B shows an exemplary timing circuitry gate voltage controller block (810) which uses timing trim control signals TT1-TT4 to selectively adjust the gate voltages of transistors in logic gates of the timing circuitry to individually introduce or remove delay from specific control signals (SP, SP1, SP3, SP2, SP4) for the switches (210, 215-1, 215-2, 220-1, 220-2) of the sample-and-hold circuits (105, 110, FIGS. 1-2).

FIGS. 9A-9D show illustrative timing adjustment circuitry (905) that can be used to selectively adjust the timing of control signals to compensate for timing offsets between first and second time-interleaved sample-and-hold circuits (105, 110, FIGS. 1-2). The timing adjustment circuitry (905) is configured to output timing trim control signals (TT1 to TTN) to incrementally introduce or remove delay from timing circuitry that produces timing control signals for the sample-and-hold circuits (105, 110, FIGS. 1-2) and/or the common sampling switch (210, FIG. 2). The timing adjustment circuitry (905) may store a state of each of the timing trim control signals using some form of latches. For example, the timing adjustment circuitry (905) may include a flip-flop, digital register, entry in volatile or non-volatile memory, or other form of storing a digital bit for each respective timing trim control signal (TT1 to TTN). In some examples, this stored state may be output as the timing trim control signals (TT1 to TTN).

The timing adjustment circuitry (905) may be configured to change the state of each timing trim control signal (TT1 to TTN) in order to adjust the timing delay between two control signals (e.g., SP and SP1) for the sample-and-hold circuits (105, 110, FIGS. 1-2). For example, where each timing trim control signal (TT1 to TTN) controls the state of an individual switch for a switchable capacitor or a selectively extensible conductive path, the timing adjustment control and outputs a bit for each switchable capacitor switch, the timing adjustment circuitry (905) may include a memory controller or other circuitry that writes a new value to a bit corresponding to a the timing trim control signal for a switch whose state needs to be changed. The new state may then be stored and output as a control signal to change the state of that switch.

Figure 9A:
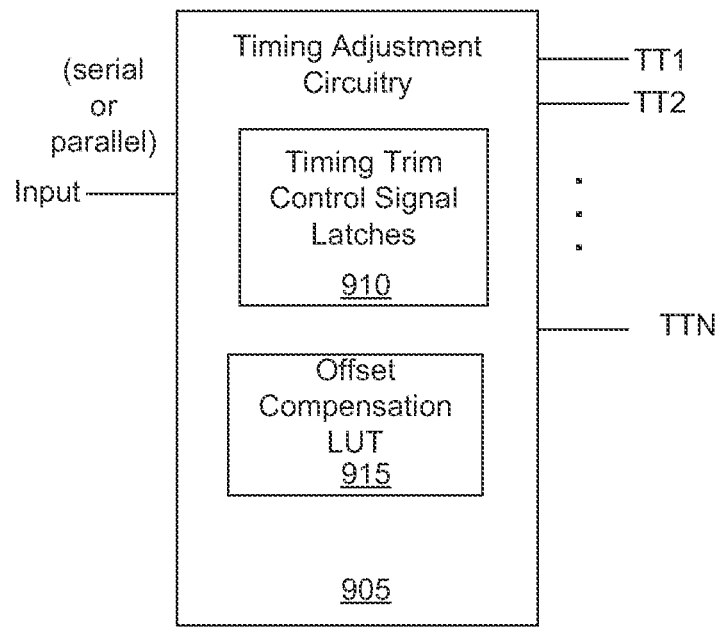
FIGS. 9A-9C are diagrams of illustrative control blocks for adjusting timing circuitry in an illustrative time-interleaved sample-and-hold system, according to one example of principles described herein.

In the example of FIG. 9A, the state timing trim control signals (TT1 to TTN) may be changed in response to a request or other input received from an external process. The input may specify a value for each of the timing trim control signals (TT1 to TTN), or simply a new value for the timing trim control signals (TT1 to TTN) for which a state change is to be made. In other examples, the instruction may simply specify a desired change in timing between a specified set of control signals (SP, SP1, SP3, SP2, SP4) for the sample-and-hold circuits (105, 110, FIGS. 1-2) and/or the common sampling switch (210, FIG. 2). The timing adjustment circuitry (905) may then determine one or more changes to be made to the state of the timing trim control signals (TT1 to TTN) to implement the requested timing change. In some examples, an offset compensation look-up table (915) may specify switch configurations for switchable capacitors or selectively extensible conductive paths, or specific gate voltage values to implement desired timing changes.

Figure 9B:
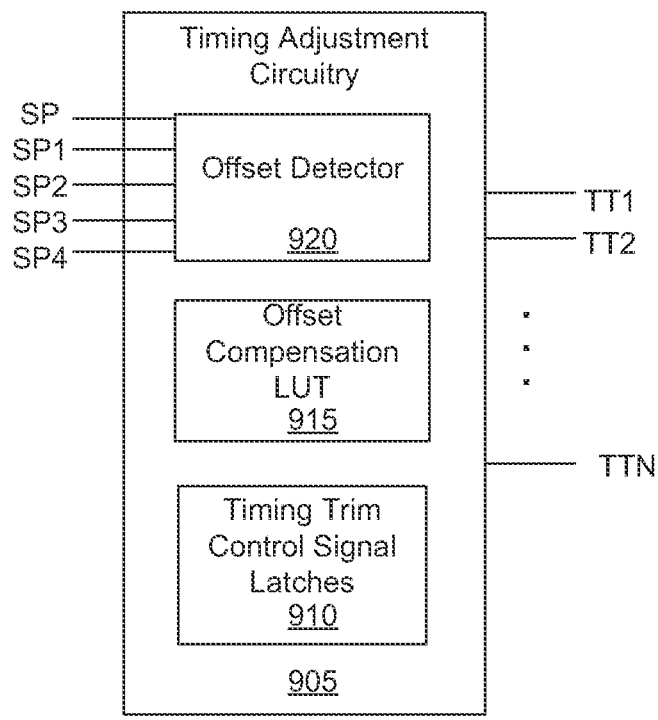

In the example of FIG. 9B, the timing adjustment circuitry (905) may be configured to monitor the control signals (SP, SP1, SP2, SP3, SP4) for the sample-and-hold circuits (105, 110, FIGS. 1-2) and the common sampling switch (210, FIG. 2) and automatically change the state of one or more of the timing trim control signals (TT1 to TTN) in response to an undesirable timing offset between two or more of the control signals for the sample-and-hold circuits (105, 110, FIGS. 1-2) as detected by an offset detector (920). In other examples, the offset detector (920) may perform a Fast Fourier Transform on an output signal ($V_{out}$) from a time-interleaved sample-and-hold system to detect signal anomalies indicative of a timing mismatch between sample-and-hold circuits (105, 110, FIG. 1).

Figure 9C:
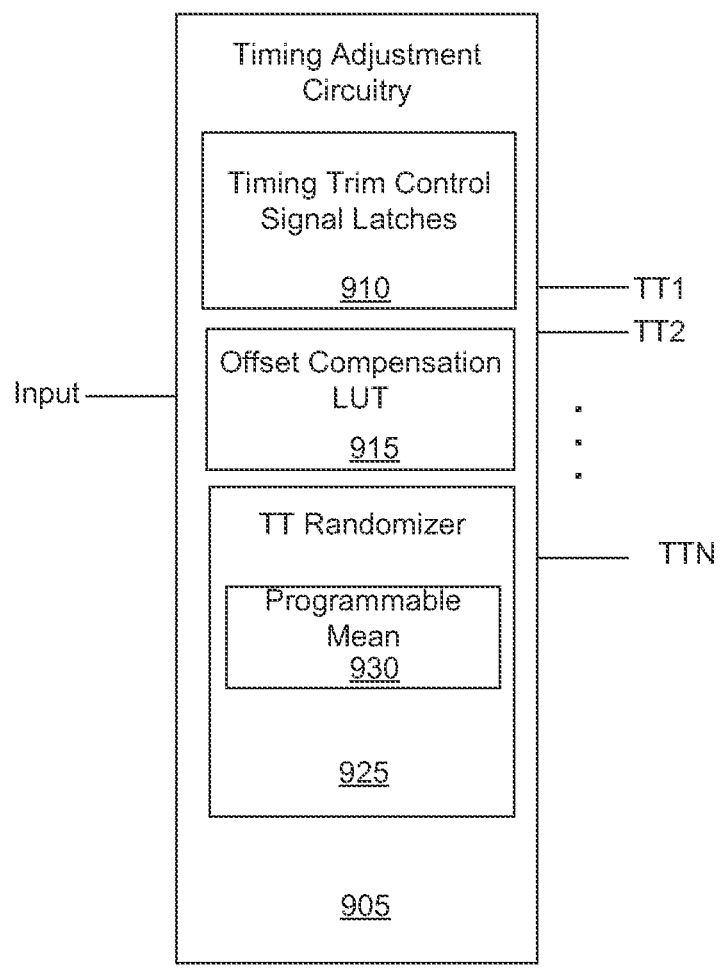

As shown in the example of FIG. 9C, timing adjustment circuitry (905) may further include a timing trim control signal randomizer (925). This randomizer (925) may introduce an element of randomness or pseudo-randomness to at least one of the timing trim control signals (TT1 to TTN). For example, the value of the selected at timing trim control signal(s) may randomly or pseudo-randomly change with each sampling cycle. The introduction of randomness or pseudo-randomness to one or more of the timing trim control signals (TT1 to TTN) may change when samples are taken slightly from sample to sample, in a random way, thereby providing the advantage of spreading the energy of any generated inter-modulation spurs in the output of the time-interleaved sample-and-hold circuits (105, 110, FIGS. 1-2) such that these inter-modulation spurs are indistinguishable from noise.

In certain embodiments, the mean on-time for the randomized timing trim control signal(s) may be programmable to zero or to another finite non-zero value. For example, a programmable mean value (930) may be stored in the timing adjustment circuitry and used in the randomization of at least one of the timing trim control signals (TT1 to TTN). To illustrate the advantages associated with a programmable mean on-time, consider the example of a time-interleaved sample-and-hold system (200, FIG. 2) with one or more randomized timing trim control signals (TT1 to TTN) for which an inter-modulation delay between the two sample-and-hold circuits (105, 110, FIGS. 1-2) exists. By increasing or decreasing the mean on-time of the one or more randomized timing trim control signals (TT1 to TTN), the inter-modulation delay can be compensated for while preserving the benefits of randomization.

Figure 10:
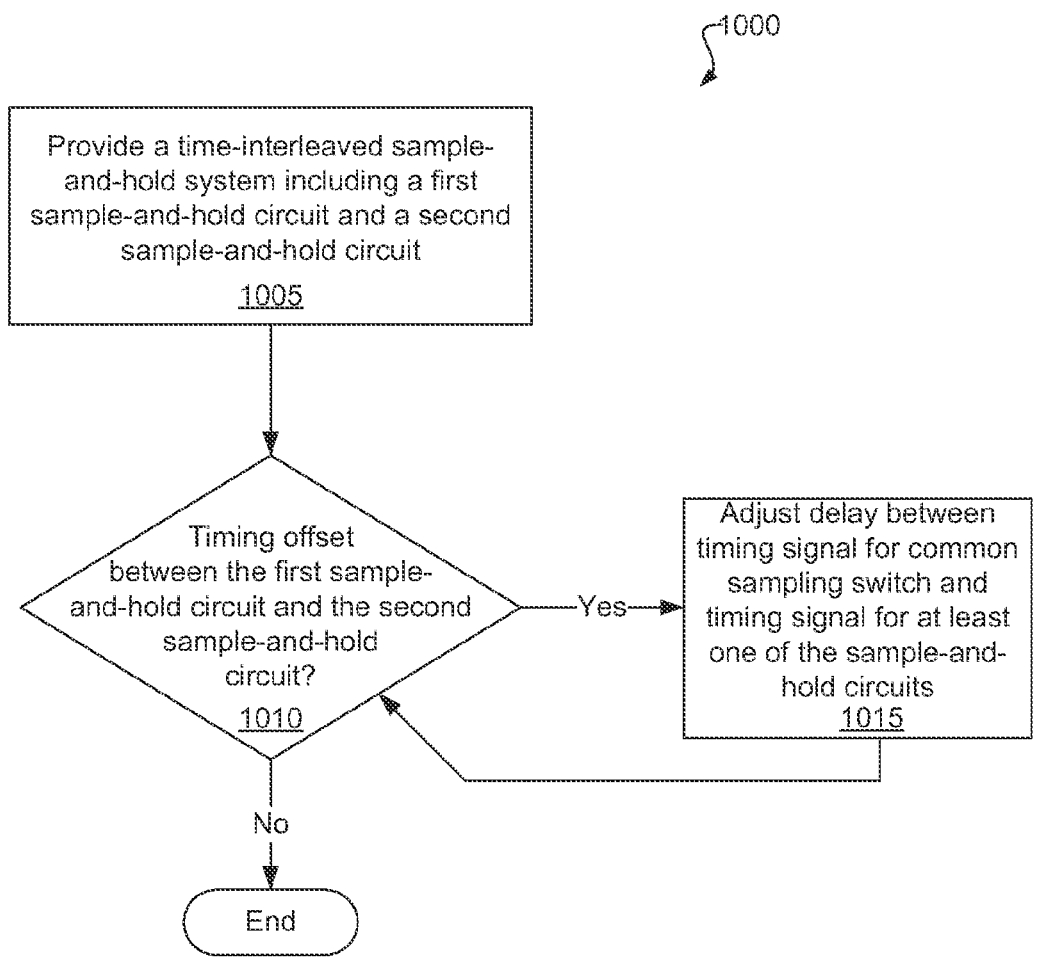
FIG. 10 is a flowchart diagram of an illustrative method of adjusting timing in an illustrative time-interleaved sample-and-hold system, according to one example of principles described herein.

Referring now to FIG. 10, a block diagram is shown of an illustrative method (1000) of remediating a timing offset between a first sample-and-hold circuit and a second sample-and-hold circuit in a time-interleaved sample-and-hold system. According to the method (1000), the aforementioned time-interleaved sample-and-hold system is provided (block 1005). It is then determined (block 1010) if a timing offset exists between the first sample-and-hold circuit and the second sample-and-hold circuit. For example, a timing offset may exist between the two sample-and-hold circuits if a time interval between a common sampling switch closing and one of the switches of the first sample-and-hold circuit closing at the end of a sampling operation of the first sample-and-hold circuit does match the time interval between the common sampling switch closing and a corresponding switch of the second sample-and-hold circuit closing at the end of a sampling operation of the second sample-and-hold circuit. This timing offset may be detected automatically by timing adjustment circuitry in the time-interleaved sample-and-hold system. Alternatively, the timing offset may be detected by a process external to the time-interleaved sample-and-hold system.

If such a timing offset is found to exist (block 1010), an adjustment is made (block 1015) to the delay between a timing signal for the common sampling switch (210, FIG. 2) and a timing signal for at least one of the sample-and-hold circuits. In some examples, at least one timing trim control signal may be identified and adjusted automatically in response to determining the timing offset exists. Additionally or alternatively, at least one timing trim control signal may be identified in a manual instruction received in the time-interleaved sample-and-hold system from an external process such that the time-interleaved sample-and-hold system adjusts the timing trim control signal identified in the manual instruction.

If an unacceptable timing offset still exists (block 810) between the first sample-and-hold circuit and the second sample-and-hold circuit, the process of switching (block 815) at least one shunt capacitor in the timing circuit of the time-interleaved sample-and-hold system may be repeated until the timing offset is negligible or within an acceptable range.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

Having thus described the invention of the present application in detail and by reference to embodiments thereof, it will be apparent that modifications and variations are possible without departing from the scope of the invention defined in the appended claims.

What is claimed is:

1. A time-interleaved sample-and-hold system, comprising:
    a first sample-and-hold circuit; and
    a second sample-and-hold circuit;
    wherein said first sample-and-hold circuit and said second sample-and-hold circuit share a common sampling switch; and
    timing adjustment circuitry for separately adjusting timing control signals to said sample-and-hold circuits based on timing of a timing control signal for said common sampling switch, wherein said timing adjustment circuitry dynamically adjusts the timing control signals to said sample-and-hold circuits during operation of said system using at least one timing trim control signal output from said timing adjustment circuitry.

2. The time-interleaved sample-and-hold system of claim 1, wherein said timing adjustment circuitry is further configured to generate at least one control signal for each said sample-and-hold circuit based on said timing control signal for said common sampling switch, wherein said timing circuit separately adjusts said controls signals to said first and second sample-and-hold circuits to minimize timing mismatch.

3. The time-interleaved sample-and-hold system of claim 1,
    wherein each said sample-and-hold circuit comprises a plurality of switches; and
    wherein said timing adjustment circuitry is configured for selectively adjusting a timing control signal of at least one of said sample-and-hold circuits by selectively altering at least one timing control signal for at least one said switch in at least one said sample-and-hold circuit.

4. The time-interleaved sample-and-hold system of claim 3, in which said timing adjustment circuitry selectively alters said timing of said at least one of said timing control signals incrementally.

5. The time-interleaved sample-and-hold system of claim 3, wherein said timing adjustment circuitry selectively alters said timing of said at least one of said timing control signals to compensate for a timing offset between said first sample-and-hold circuit and said second sample-and-hold circuit.

6. The time-interleaved sample-and-hold system of claim 5, wherein said timing adjustment circuitry comprises a plurality of logic gates.

7. The time-interleaved sample-and-hold system of claim 6,
    wherein said timing adjustment circuitry comprises a switchable shunt capacitor disposed between two of said logic gates; and
    wherein said timing adjustment circuitry selectively alters said timing of said at least one of said timing control signals for said sample-and-hold circuits by switching said shunt capacitor.

8. The time-interleaved sample-and-hold system of claim 6,
wherein said timing adjustment circuitry comprises a selectively extensible conduction path disposed between two of said logic gates; and
wherein said timing adjustment circuitry selectively alters said timing of said at least one of said timing control signals for said sample-and-hold circuits by altering a length of said selectively extensible conduction path.

9. The time-interleaved sample-and-hold system of claim 5,
wherein said timing adjustment circuitry comprises a plurality of transistors; and
wherein said timing adjustment circuitry selectively alters said timing of said at least one of said timing control signals for said sample-and-hold circuits by altering a voltage used to activate at least one said transistor in said plurality of transistors.

10. The time-interleaved sample-and-hold system of claim 5, wherein said timing adjustment circuitry is configured to detect said timing offset and automatically adjust said timing trim control signal to cause said timing adjustment circuitry to alter said timing of said at least one of said timing control signals to compensate for said timing offset.

11. The time-interleaved sample-and-hold system of claim 5, wherein said timing adjustment circuitry is further configured to adjust said timing trim control signal according to an instruction received externally.

12. The time-interleaved sample-and-hold system of claim 5, wherein said timing adjustment circuitry is configured to randomize at least one said timing trim control signal.

13. The time-interleaved sample-and-hold system of claim 12, wherein said timing adjustment circuitry is configured to randomize said at least one said timing trim control signal with each cycle of at least one of said sample-and-hold circuits.

14. The time-interleaved sample-and-hold system of claim 13, wherein a mean on time of said at least one randomized said timing trim control signal is programmable in said timing adjustment circuitry.

15. The time-interleaved sample-and-hold system of claim 1, wherein said timing adjustment circuitry also selectively alters said timing of said timing control signal for said common sampling switch.

16. The time interleaved sample-and-hold system of claim 1, wherein each of the first and second sample-and-hold circuits comprise two sampling transistor switches connected in series with said common sampling switch, each sampling transistor switch controlled by a separate channel clock signal, wherein a timing of at least one of the separate channel clock signals is subject to adjustment by said timing adjustment circuitry with respect to said timing control signal of said common sampling switch.

17. The time interleaved sample-and-hold system of claim 1, wherein said timing adjustment circuitry comprises an offset detector for dynamically detecting an offset among said timing control signals.

18. The time interleaved sample-and-hold system of claim 17, wherein said timing adjustment circuitry further comprises an offset compensation look-up table with which adjustments to said timing control signals are.

19. A time-interleaved sample-and-hold system, comprising:
a first sample-and-hold circuit comprising a first voltage storage element electrically coupled to a first switch and a second switch;
a second sample-and-hold circuit comprising a second voltage storage element electrically coupled to a third switch and a fourth switch;
an input node electrically coupleable to said first voltage storage element and said second voltage storage element through said first switch and said third switch, respectively;
a common sampling switch electrically coupled to said second switch and said fourth switch; and
timing adjustment circuitry for adjusting a timing control signal for at least one of said sample-and-hold circuits based on timing of a timing control signal for said common sampling switch, wherein said timing adjustment circuitry dynamically adjusts the timing control signals to said sample-and-hold circuits during operation of said system using at least one timing trim control signal output from said timing adjustment circuitry.

20. The time-interleaved sample-and-hold system of claim 19, wherein at least one of said first and second voltage storage elements comprises a capacitor.

21. The time-interleaved sample-and-hold system of claim 19, wherein said timing adjustment circuitry is further configured to adjust said timing control signal for said common sampling switch.

22. The time-interleaved sample-and-hold system of claim 19, wherein said timing adjustment circuitry is further configured to generate a timing control signal for each said switch in each said sample-and-hold circuit based on said timing control signal for said common sampling switch.

23. The time-interleaved sample-and-hold system of claim 22, wherein said timing adjustment circuitry is further configured to selectively alter a timing of at least one timing control signal for at least one of said second switch, and said fourth switch.

24. The time-interleaved sample-and-hold system of claim 23, in which said timing adjustment circuitry selectively alters said timing of said at least one of said timing control signals incrementally.

25. The time-interleaved sample-and-hold system of claim 23, wherein said timing adjustment circuitry selectively alters said timing of said at least one of said timing control signals to compensate for a timing offset between said first sample-and-hold circuit and said second sample-and-hold circuit.

26. The time-interleaved sample-and-hold system of claim 25, wherein said timing adjustment circuitry comprises a plurality of logic gates.

27. The time-interleaved sample-and-hold system of claim 26,
wherein said timing adjustment circuitry comprises a switchable shunt capacitor disposed between two of said logic gates; and
wherein said timing adjustment circuitry selectively alters said timing of said at least one of said timing control signals by switching said shunt capacitor.

28. The time-interleaved sample-and-hold system of claim 26,
wherein said timing adjustment circuitry comprises a selectively extensible conduction path disposed between two of said logic gates; and
wherein said timing adjustment circuitry selectively alters said timing of said at least one of said timing control signals by altering a length of said selectively extensible conduction path.

29. The time-interleaved sample-and-hold system of claim 25,
wherein said timing adjustment circuitry comprises a plurality of transistors; and wherein said timing adjustment circuitry selectively alters said timing of said at least one of said timing control signals by altering a voltage used to activate at least one said transistor in said plurality of transistors.

30. The time-interleaved sample-and-hold system of claim 25, wherein said timing adjustment circuitry is configured to detect said timing offset and automatically adjust said timing trim control signal to cause said timing adjustment circuitry to alter said timing of said at least one of said timing control signals to compensate for said timing offset.

31. The time-interleaved sample-and-hold system of claim 25, wherein said timing adjustment circuitry is further configured to adjust said timing trim control signal according to an instruction received externally.

32. The time-interleaved sample-and-hold system of claim 25, wherein said timing adjustment circuitry is configured to randomize at least one said timing trim control signal.

33. The time-interleaved sample-and-hold system of claim 32, wherein said timing adjustment circuitry is configured to randomize said at least one said timing trim control signal with each cycle of at least one of said sample-and-hold circuits.

34. The time-interleaved sample-and-hold system of claim 33, wherein a mean on time of said at least one randomized said timing trim control signal is programmable in said timing adjustment circuitry.

35. A method of remediating a timing offset between a first sample-and-hold circuit and a second sample-and-hold circuit in a time-interleaved sample-and-hold system, said method comprising dynamically adjusting a delay between a timing signal for a common sampling switch electrically coupled to said first and second sample-and-hold circuits and a timing signal for at least one of said sample-and-hold circuits to compensate for said timing offset using at least one timing trim control signal output from a timing adjustment circuitry.

36. The method of claim 35, further comprising detecting said timing offset and automatically adjusting said delay.

37. The method of claim 35, further comprising adjusting said delay in response to a manual instruction.

* * * * *